(12) United States Patent
Snyder et al.

(10) Patent No.: US 9,171,916 B1
(45) Date of Patent: Oct. 27, 2015

(54) LDMOS WITH THICK INTERLAYER-DIELECTRIC LAYER

(75) Inventors: David L. Snyder, Beaverton, OR (US); Sudarsan Uppili, Portland, OR (US); Guillaume Bouche, Beaverton, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 228 days.

(21) Appl. No.: 13/272,301

(22) Filed: Oct. 13, 2011

(51) Int. Cl.
*H01L 29/40* (2006.01)
*H01L 21/8238* (2006.01)

(52) U.S. Cl.
CPC ........ *H01L 29/402* (2013.01); *H01L 21/82385* (2013.01)

(58) Field of Classification Search
None
See application file for complete search history.

(56) References Cited

U.S. PATENT DOCUMENTS

| | | | |
|---|---|---|---|
| 6,303,961 B1 * | 10/2001 | Shibib | 257/335 |
| 2002/0090757 A1 * | 7/2002 | Komori | 438/110 |
| 2002/0145172 A1 * | 10/2002 | Fujishima et al. | 257/487 |
| 2007/0080398 A1 * | 4/2007 | Lee et al. | 257/340 |
| 2012/0037988 A1 * | 2/2012 | Hao | 257/343 |

OTHER PUBLICATIONS

Adriaan W. Ludikhuize; A Review of RESURF Technology; ISPS0'2000, May 22-25, Toulouse, France; 2000.

* cited by examiner

*Primary Examiner* — Bilkis Jahan
*Assistant Examiner* — Kevin Quinto
(74) *Attorney, Agent, or Firm* — Advent, LLP

(57) ABSTRACT

Semiconductor devices, such as LDMOS devices, are described that include an interlayer-dielectric layer (ILD) region having a thickness of at least two and one half (2.5) microns to increase the maximum breakdown voltage. In one or more implementations, the semiconductor devices include a substrate having a source region and a drain region formed proximate to a surface of the substrate. A gate is positioned over the surface and between the source region and the drain region. An ILD region having a thickness of at least two and one half (2.5) microns is formed over the surface and the gate of the device. The device also includes one or more field plates configured to shape an electrical field generated between the source region and the drain region when a voltage is applied to the gate.

13 Claims, 4 Drawing Sheets

LDMOS WITH THICK INTERLAYER-DIELECTRIC LAYER

BACKGROUND

Laterally diffused metal oxide semiconductor (LDMOS) devices are used in power application devices because the devices are easily integrated in BIPOLAR-CMOS-DMOS (BCD) processes and can extend the voltage capability of the technology with the laterally diffused junction device. For example, high voltage LDMOS devices may be used in lighting, motor control and switch-mode power supply applications. LDMOS devices rely on a shallow conduction layer formed under a LOCOS ("local oxidation of silicon") region or a STI (shallow trench isolation) region to handle the higher drain voltage, when the device is biased.

The on-state resistance ("$R_{ON}$") and the maximum breakdown voltage ("$BV_{DSS}$") of the device are two (2) important characteristics of LDMOS designs. These characteristics are important for the operating parameters for the LDMOS devices, which dictate the applications in which the devices may be used. On-state resistance is typically dependent upon the design/layout of the device, the process condition, temperature, diffusion length, and the various materials used to fabricate the devices. Breakdown voltage is defined as the largest reverse voltage that can be applied to a diode (e.g., a p-n junction) without causing an exponential increase in the current of the diode.

SUMMARY

Semiconductor devices, such as LDMOS devices, are described that include an interlayer-dielectric layer (ILD) region having a thickness of at least two and one half (2.5) microns to increase the maximum breakdown voltage. In one or more implementations, the semiconductor devices include a substrate having a source region of a first conductivity type and a drain region of the first conductivity type formed proximate to a surface of the substrate. A gate is positioned over the surface and between the source region and the drain region. The gate is configured to receive a voltage so that a conduction region may be formed at least partially below the gate to allow majority carriers to travel between the source region and the drain region. An ILD region having a thickness of at least two and one half (2.5) microns is formed over the surface and the gate of the device. The device also includes one or more field plates configured to shape an electrical field generated between the source region and the drain region when a voltage is applied to the gate.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

LDMOS transistor devices are employed when microelectronic devices require higher voltages and a higher power. The on-state resistance and the breakdown voltage (e.g., operating voltage) are important characteristics when developing the devices. Therefore, devices having higher breakdown voltages and lower on-state resistance are desired. For example, increasing the drift area length increases the breakdown voltage; however, this also increases the on-state resistance, which is an undesired effect.

Semiconductor LDMOS devices rated at four hundred volts (400V) and greater are integrated in low cost technologies for a variety of reasons. First, the geometry size is necessarily large to support the high voltages. Second, integrating such large devices in small geometry, low-voltage technologies are not cost effective. Third, ultra-high voltages must be carefully isolated from the delicate low-voltage circuitry so as to not damage the low-voltage circuitry. As a result, the equipment tools used in the LDMOS technologies to etch contacts and deposit metals limit the interlayer-layer dielectric (ILD) thickness to approximately one and one half (1.5) microns.

Therefore, techniques are described to form semiconductor devices, such as LDMOS devices, that include an ILD region having a thickness of at least two and one half (2.5) microns to increase the maximum breakdown voltage without significantly increasing the on-state resistance. In one or more implementations, the semiconductor devices include a substrate having a source region of a first conductivity type and a drain region of the first conductivity type formed proximate to a surface of the substrate. The source region may be formed in a well region of a second conductivity type, and the drain region is formed in an extended drain region. The extended drain region may further include a reduced surface field (RESURF) region of a second conductivity type that is disposed between the source and drain regions. A gate is positioned over the surface and between the source region and the drain region. The gate is configured to receive a voltage so that a conduction region may be formed at least partially below the gate to allow majority carriers to travel between the source region and the drain region. An ILD region having a thickness of at least two and one half (2.5) microns is formed over the surface and the gate of the device. The ILD region(s) may have various silicon-to-oxide ratios to reduce potential fabrication defects (e.g., cracking during back grinding, etc.) in the semiconductor devices. The device also includes one or more field plates configured to shape an electrical field generated between the source region and the drain region when a voltage is applied to the gate.

In the following discussion, an example semiconductor device is first described. Exemplary procedures are then described that may be employed to fabricate the example semiconductor device.

Example Implementations

Figure 1A:
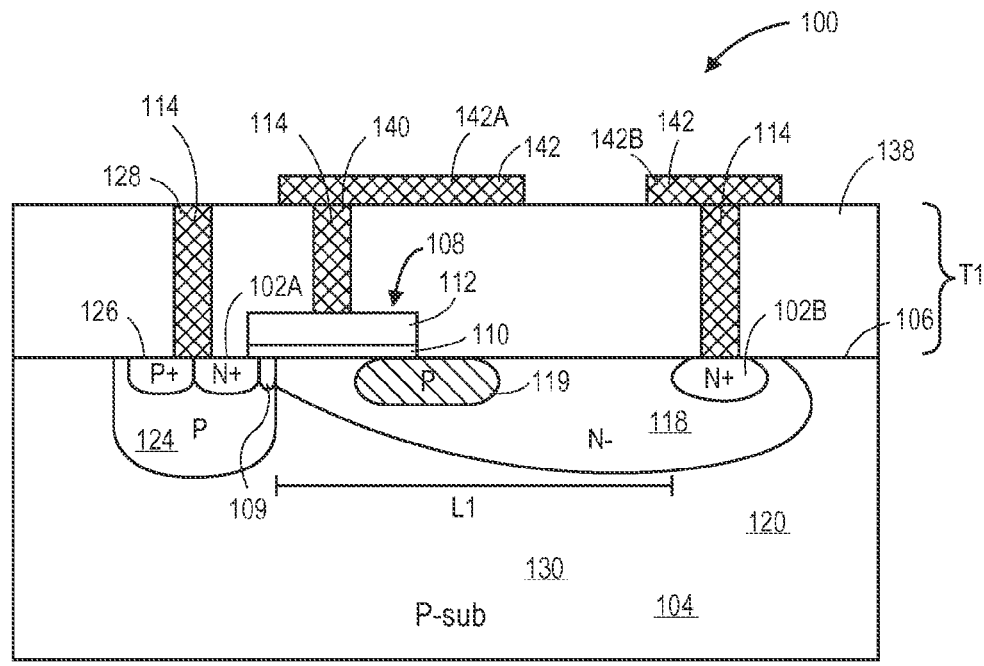
FIG. 1A is a diagrammatic partial cross-sectional view illustrating an implementation of a LDMOS device in accordance with an example implementation of the present disclosure.
Figure 1B:
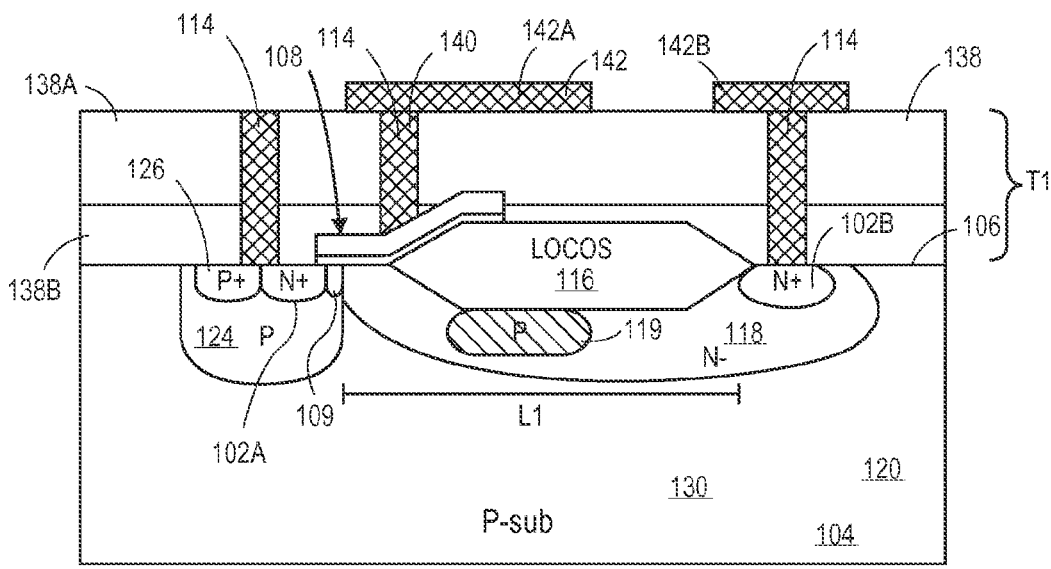
FIG. 1B is a diagrammatic partial cross-sectional view illustrating another implementation of a LDMOS device in accordance with another example implementation of the present disclosure.

FIGS. 1A and 1B illustrate lateral diffused MOS (LDMOS) semiconductor devices 100 in accordance with example implementations of the present disclosure. For instance, the LDMOS devices 100 may be rated at four hundred volts (400V) and greater. As shown, the LDMOS device 100 includes one or more active regions 102 (e.g., a source region 102A, a drain region 102B) formed in a substrate 104. The active regions 102 are utilized to create the source and drain regions of the LDMOS transistor. The active regions 102 may be configured in a variety of ways. In an implementation, the active regions 102 are capable of providing charge carriers to the substrate 104. For example, an active silicon region 102 may be comprised of an n-type diffusion region (e.g., a first conductivity type) that is capable of providing extra conduction electrons as charge carriers. In another example, an active silicon region 102 may be comprised of a p-type diffusion region (e.g., a second conductivity type) that is capable of providing extra holes as charge carriers. The one or more active regions 102 are formed proximate to a surface 106 of the substrate 104.

The substrate 104 comprises a base material utilized to form one or more integrated circuit devices through various semiconductor fabrication techniques, such as photolithography, ion implantation, deposition, etching, and so forth. In one or more implementations, the substrate 104 comprises a portion of a silicon wafer that may be configured in a variety of ways. For example, the substrate 104 may comprise a portion of an n-type silicon wafer or a portion of a p-type silicon wafer. In an implementation, the substrate 104 may comprise group V elements (e.g., phosphorus, arsenic, antimony, etc.) configured to furnish n-type charge carrier elements. In another implementation, the substrate 104 may comprise group MA elements (e.g., boron, etc.) configured to furnish p-type charge carrier elements.

The devices 100 also include a gate 108 that is formed over the surface 106 and between the active regions 102A, 102B. A conduction region 109 is formed below the gate 108 when a voltage of correct polarity and a value greater than a threshold voltage ($V_t$) of the device 100 is applied to the gate 108. The conduction region 109 establishes a conducting channel through which majority carriers can travel between the source region 102A and the drain region 102B. The gate 108 is configured in a variety of ways. The gate 108 includes a dielectric layer 110 disposed between the surface 106 and a polycrystalline silicon (polysilicon) layer 112. In one or more implementations, the dielectric layer 110 may comprise a gate oxide material, such as silicon dioxide ($SiO_2$), a nitride material, or the like. Moreover, the polysilicon layer 112 may include a silicide material to lower the resistivity of the polysilicon layer 112. The thickness of the gate 108 may vary as a function of the requirements (e.g., manufacturability, operating frequency, gain, efficiency, etc.) of the device 100. For example, the thickness of the gate may range from approximately two hundred (200) Angstroms to approximately one thousand (1,000) Angstroms.

The active regions 102A, 102B and the gate 108 each have a contact (e.g., an electrode) 114 that provides electrical interconnection capabilities between various components of devices 100. The contacts 114 may be configured in a variety of ways. For example, the contacts 114 may be comprised of a metal one (metal 1) material, a metal two (metal 2) material, and so forth. The contacts 114 may include vias that provide a vertical electrical connection between different layers of the device 100. For instance, a first via may provide an electrical interconnect to a drain contact 114 formed proximate to the surface 106 and disposed under various device 100 layers (e.g. passivation layers, insulation layers, etc.).

As illustrated in FIG. 1B, the gate 108 may be at least partially positioned over a localized oxidation of silicon (LOCOS) region 116 or a Shallow Trench isolation (STI) region. The LOCOS region 116 (or STI region) is comprised of selected areas (e.g., region 116) of silicon dioxide ($SiO2$) formed in the substrate 104 so that a Si—$SiO_2$ interface of region 116 occurs at a lower point than the surface 106. The LOCOS region 116 is configured to improve the voltage isolation between the first active region 102 (e.g., the source) and the second active region 102 (e.g., the drain), as well as other surrounding integrated circuit devices. The LOCOS region 116 may range from approximately two thousand (2000) Angstroms to approximately twenty thousand (20,000) Angstroms. It is contemplated that varying thicknesses of the LOCOS region 116 may utilized depending the voltage rating of the LDMOS device 100.

The semiconductor device 100 also includes an extended drain region 118 (e.g., a drift region). In one or more implementations, the extended drain region 118 may at least partially extend under the LOCOS regions 116 (see FIG. 1B). As illustrated in FIGS. 1A and 1B, the extended drain region 118 surrounds the drain region 102B. The extended drain region 118 also serves in conjunction with a conductivity type opposite the conductivity type of the extended drain region 118 to form a reduced surface field (RESURF) region 119 that functions to create a uniform drift region field to manipulate device 100 breakdown voltage. The electric field across the drift region may be manipulated by the length of the extended drain region (L1), the doping profile and the thickness of the extended drain region 118. Thus, it is contemplated that various lengths, doping profiles and thicknesses of the extended drain region 118 may be utilized depending on the requirements (e.g., breakdown voltage value, operating voltages, etc.) of the LDMOS devices 100. In one or more implementations, the extended drain region 118 may be formed from a dopant concentration (of the first conductivity type) of approximately $5\times10^{14}/cm^3$ to $5\times10^{16}/cm^3$. However, it is contemplated that other dopant concentrations may be utilized depending on the requirements (e.g., the on-state resistance, etc.) of the devices 100. The extended drain region 118 is bounded by a second conductivity region (e.g., a p-substrate region) 120 (shown in FIGS. 1A and 1B). Moreover, the length (L1) of the extended drain region 118 extends approximately from the drain region 102B a well region 124.

As shown in FIGS. 1A and 1B, the p-substrate region 120 surrounds the well region 124. The well region 124 is comprised of a second conductivity type (e.g., a p-well) and is at least partially covered by the gate 108. The source region 102A and the body contact region 126 are included in the well region 124. In one or more implementations, the source region 102A is comprised of a first conductive type, such as an n+ dopant material. The back-gate region 126 is comprised of a second conductive type, such as a p+ dopant material. In one or more implementations, the body region 126 and the source region 102A are tied together with a source electrode 128 (e.g., contact 114) to reduce parasitic effects.

FIGS. 1A and 1B illustrate the LDMOS devices 100 fabricated in a bulk substrate 130 of a second conductive type, such as a p-substrate.

The LDMOS device 100 includes one or more interlayer-dielectric (ILD) regions 138 having a thickness (T1) approximately equal to or greater than two and one half (2.5) microns formed over the surface 106. It is contemplated that devices 100 rated four hundred volts (400V) and greater may incorporate ILD regions 138 having a thickness approximately equal to or greater than two and one half (2.5) microns. In an implementation, the ILD region 138 may comprise a unitary ILD region 138 having a thickness approximately equal to or greater than two and one half (2.5) microns as shown in FIG. 1A. In another implementation, as shown in FIG. 1B, a first ILD region 138A may be formed over the surface 106 of the device 100. Then, a second ILD region 138B may be formed over the first ILD region 138A. In this arrangement, the combined thickness (T1) of ILD regions 138A and 138B are approximately equal to or greater than 2.5 microns. It is contemplated that the ILD region(s) 138 (e.g., unitary region 138, first and second ILD regions 138A, 138B) may have a metal 1 layer formed over the ILD region(s) 138 or a metal 2 (and above) layers formed over the ILD regions(s) 138. For instance, as described above a second ILD region 138B may have a metal 1, a metal 2, a metal 3, and so forth, formed over the ILD region 138B. For example, the ILD regions 138 may have a combined thickness that is greater than the two and one half (2.5) microns.

Figure 6:
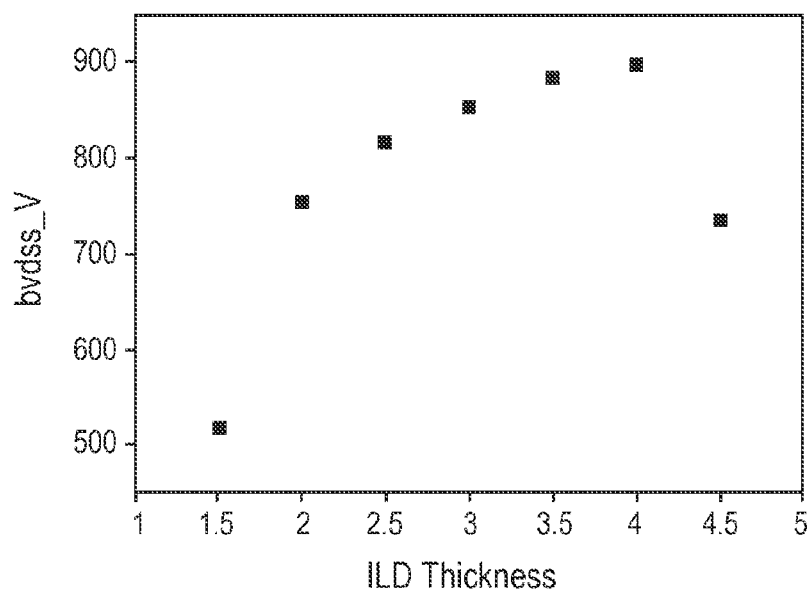
FIG. 6 is a graph illustrating breakdown voltage as a function of interlayer-dielectric layer (ILD) thickness.

The thickness (T1) of the ILD region(s) 138 may range from approximately two and one half (2.5) microns to approximately five (5) microns. The thickness (T1) of the ILD region(s) 138 may depend on the requirements (e.g., manufacturability, operating frequency, gain, efficiency, etc.) of the device 100. For example, a LDMOS device 100 having an operating voltage of seven hundred volts (700 V) may be suited to have ILD region 138 thickness of approximately two and one half (2.5) microns to increase the breakdown voltage and leave the on-state resistance relatively unchanged. In another example, a LDMOS device 100 having an operating voltage of seven hundred and fifty volts (750 V) may be suited to have ILD region 138 thickness of approximately three and one half (3.5) microns. In another example, a LDMOS device 100 having an operating voltage of eight hundred volts (800 V) may be suited to have ILD region 138 thickness of approximately four and one half (4.5) microns. While specific thicknesses have been stated above, it is understood that varying ILD region 138 thicknesses may be utilized. FIG. 6 illustrates a graph of various breakdown voltages as a function of ILD thickness. For example, a LDMOS device having an ILD thickness of four (4.0) microns had a breakdown voltage of about nine hundred volts (900 V) and an on-state resistance per unit area of about thirteen (13) ohms-millimeter$^2$, whereas a device having a ILD thickness of one and one half (1.5) microns had a breakdown voltage of five hundred seventeen volts (517 V) and an on-state resistance per unit area of about thirteen (13) ohms-millimeter$^2$. Therefore, a much higher voltage can be sustained before impact ionization occurs.

As illustrated in FIGS. 1A and 1B, one or more field plates 142 are disposed over the interlayer-dielectric regions 138. Moreover, at least one of the field plates 142 may be at least partially positioned over the gate 108 (and the LOCOS region 116 as shown in FIG. 1B). The field plate(s) 142 may be configured in a variety of ways. For example, the field plate(s) 142 may be comprised of a conductive material, such as a metal material (e.g., a metal 1 layer, a metal 2 layer, a metal 3 layer, etc.) or a polysilicon material. The field plate(s) 142 is configured to assist in shaping the electric field under the gate 108 (and the LOCOS region 116) to improve the breakdown voltage when the devices 100 are operational (e.g., when a sufficient voltage is applied to the gate 108 and across the source 102A and the drain 102B). Varying field plate 142 lengths may be utilized to modify the electrical field under the gate 108 depending on the requirements of the devices 100. For example, in an implementation, a field plate 142 may have a length approximately equal to the gate 108 length. In another implementation, a field plate 142 length may have a length greater than the gate 108 length. The gate length may range between about one tenth (0.1) of a micron to over twenty (20) microns. The field plates 142 length may range between about one half (0.5) microns to about fifty (50) microns depending upon the voltage rating of device 100. Moreover, the thickness of the field plates 142 may range from approximately two thousand (2000) Angstroms to approximately forty thousand (40,000) Angstroms. It is contemplated that the thickness of the field plate 142 may be a function of the desired operating voltage of the devices 100 (e.g., operating voltages ranging from approximately four hundred volts (400 V) to approximately three thousand volts (3000 V)).

The device 100 may also include multiple field plates 142 to provide additional control of the electric field when the device 100 is operational. For example, as shown in FIGS. 1A and 1B, a first field plate 142A is connected to the gate 108 through a contact 114A. A second field plate 142B is connected to the drain 102B through a contact 114B. In one or more implementations, the contacts 114A, 114B may comprise a conductive material (e.g., metal, polysilicon, etc.) deposited in one or more vias 144 so that there is an electrical interconnection between the field plates 142A, 142B and the gate 108 and the drain region 102B.

It will be understood that while FIGS. 1A and 1B illustrate an n-channel LDMOS device 100, the devices 100 may be fabricated as p-channel devices. For example, a p-channel device may include p-type source and drain regions, a p-type extended drain region, and so forth.

Example Fabrication Processes

Figure 2:
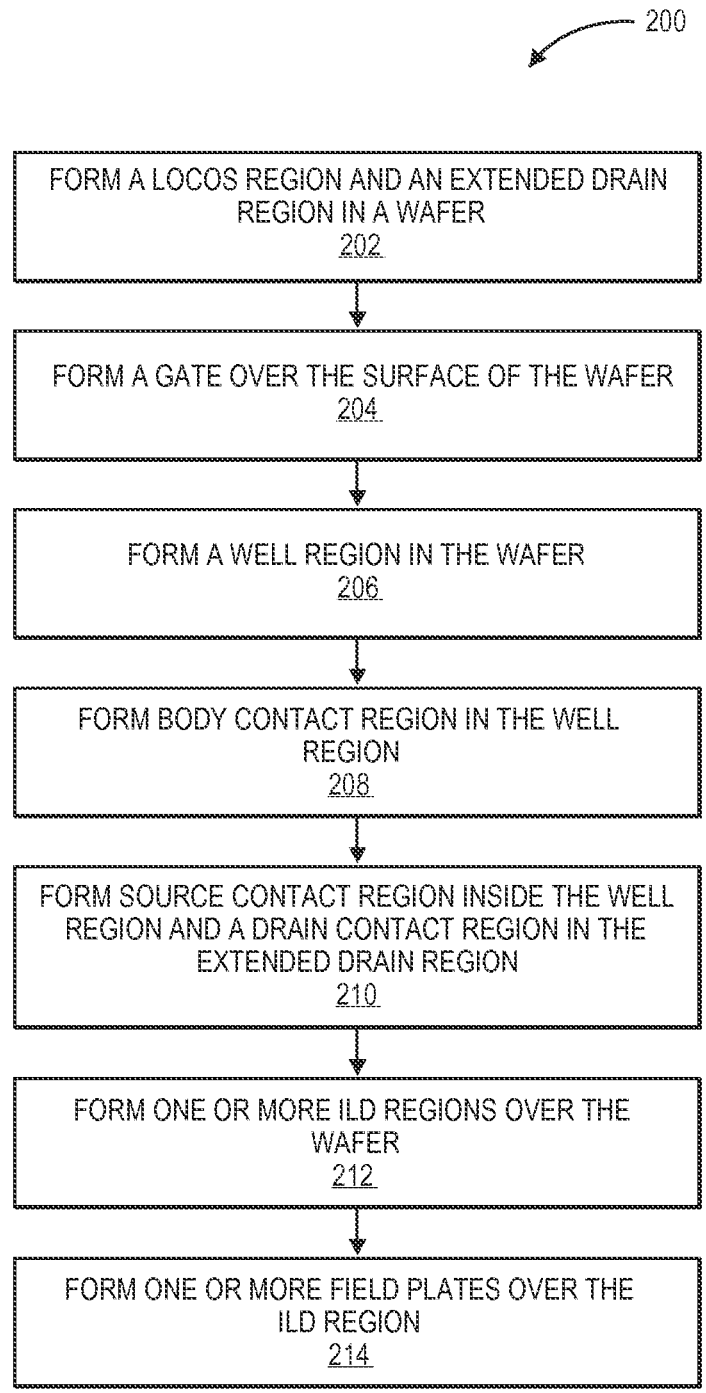
FIG. 2 is a flow diagram illustrating a process in an example implementation for fabricating LDMOS devices, such as the devices shown in FIGS. 1A and 1B.
Figure 3:
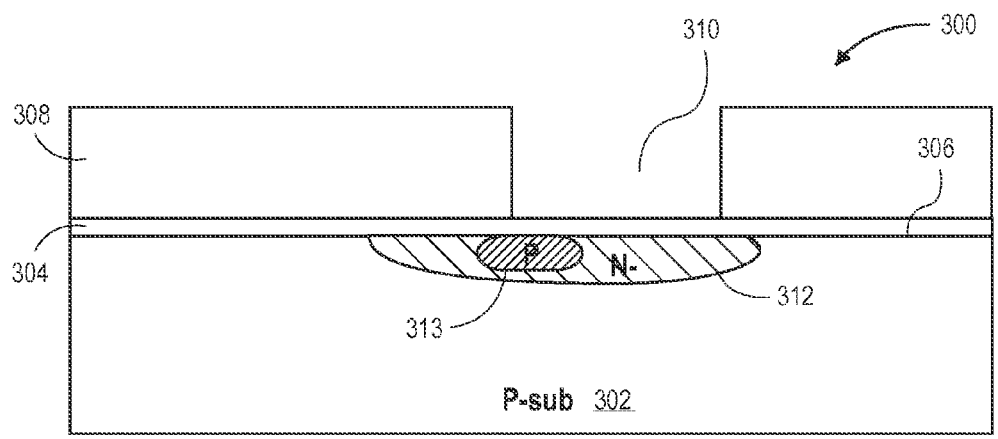
FIGS. 3 through 5 are diagrammatic partial cross-sectional views illustrating the fabrication of a LDMOS device, such as the device shown in FIG. 1B, in accordance with the process shown in FIG. 2.
Figure 4:
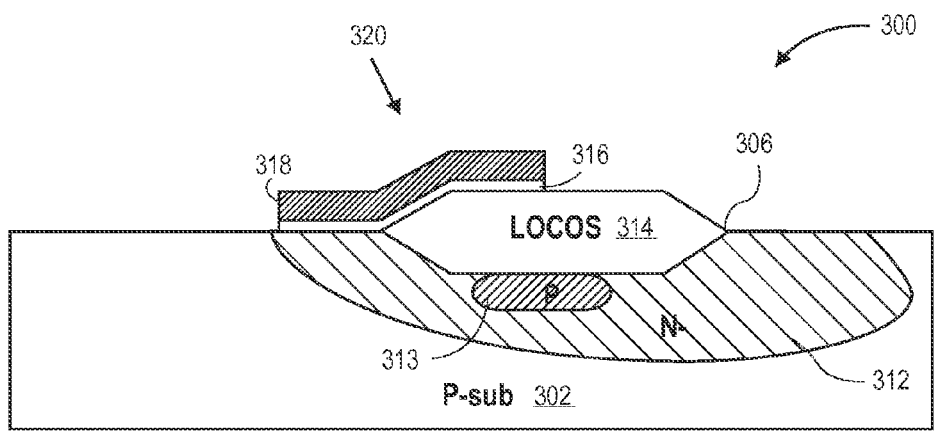
Figure 5:
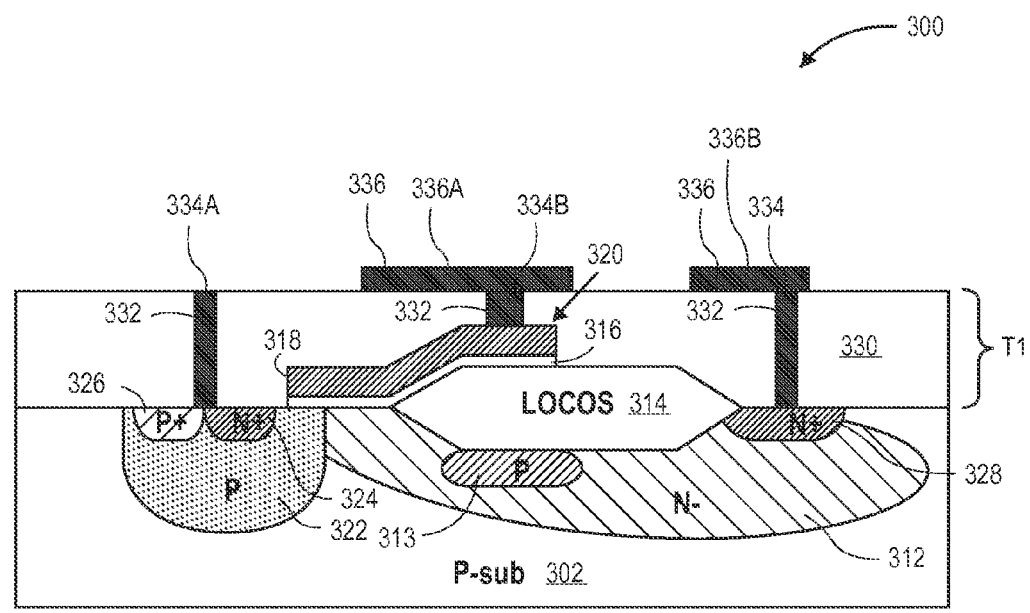

FIG. 2 illustrates an example process 200 that employs semiconductor fabrication techniques to fabricate semiconductor devices, such as the devices 100 shown in FIGS. 1A and 1B. FIGS. 3 through 5 illustrate formation of example LDMOS devices 300 in an example wafer 302. As illustrated in FIG. 2, a LOCOS region (or a STI region) and an extended drain region are formed in a wafer (Block 202). In one or more implementations, as shown in FIG. 3, a pad oxide layer 304 is formed over a surface 306 of the wafer 302. A nitride layer 308 is formed over the pad oxide layer 304. The nitride layer 308 is patterned and etched to expose an area 310 where the LOCOS region is to be formed. A first conductive material (e.g., n-type dopant) is implanted through the exposed area 310 into the wafer 302 to form the extended drain region 312. As shown in FIG. 3, the extended drain region 312 may include a RESURF region 313. For example, a second conductive type (e.g., p-type dopant) may also be implanted into the device 100 to serve as the RESURF region 313. Thermal cycling is then utilized to anneal and at least partially diffuse the extended drain region 312 while growing the LOCOS region 314 (or the STI region). In one or more implementations, the LOCOS region 314 may be grown to a thickness ranging from approximately two thousand (2000) Angstroms to approximately twenty thousand (20,000) Angstroms. Once the regions 312, 314 are formed, the pad oxide layer 304 and the nitride layer 308 are removed. In one or more implementations, the layers 304, 308 are removed via a suitable etching technique, such as a plasma etch, or the like.

A gate is formed over the surface of the wafer (Block 204). As illustrated in FIG. 4, a gate oxide layer 316 is then formed over the surface 306. In one or more implementations, the gate oxide layer 316 is thermally grown. It is contemplated that the gate oxide layer 316 thickness may vary as a function of differing voltage ratings. For example, a greater gate oxide layer 316 thickness may be utilized for greater operating voltage LDMOS devices than lower operating voltage LDMOS devices. For instance, the gate oxide layer 316 may be about 100 Angstroms for a sixty (60) volt device. A polysilicon layer 318 is then formed over the gate oxide layer 316. In one or more implementations, the polysilicon layer 318 may be formed over the gate oxide layer 316 via one or more suitable deposition techniques. The polysilicon layer 318 may then be doped with an impurity to render the layer 318 conductive. A photoresist is then applied over the polysilicon layer 318 and selectively etched to form a gate 320. The gate is configured to assist in generating a conduction layer beneath the gate 320 to allow majority carriers between the source and the drain of the LDMOS device when the device is operational.

Once the gate is formed, a well region comprised of a second conductivity type is formed in the wafer (Block 206). As illustrated in FIG. 5, a well region 322 is formed in the wafer 302. In one or more implementations, the well region 322 is comprised of a p-type dopant that is annealed after deposition to form the region 322. A body contact (e.g., back gate contact) region is then formed in the well region (Block 208). In an implementation, the source region 324 is comprised of a first conductive type (e.g., an n-type dopant), and the body contact region 326 is comprised of a second conductive material (e.g., a p+ type dopant). Suitable semiconductor formation techniques (e.g., ion implantation, deposition, annealing, etc.) may be utilized to form the source region 324 and the body contact region 326.

As illustrated in FIG. 2, a source contact region (e.g., source region) inside the well region and a drain contact region (e.g., drain region) of a first conductivity type is formed in the extended drain region (Block 210). As described above with respect to FIGS. 1A and 1B, the extended drain region 312, as illustrated in FIG. 5, has a lower doping level than the drain region 328. In one or more implementations, the extended drain region 312 may have a doping level ranging from approximately $5 \times 10^{14}/cm^3$ to approximately $5 \times 10^{16}/cm^3$. Moreover, the extended drain region 312 may have a length of approximately 30 microns to approximately 100 microns as described above and with respect to FIG. 1A.

Once the drain region is formed, one or more ILD regions are formed at least partially over the wafer (Block 212). In one or more implementations, as illustrated in FIG. 5, one or more ILD regions 330 are formed (e.g., deposited) over the surface 306. The ILD regions 330 are configured to insulate the LDMOS device 300 components (e.g., gate 320, source region 324, drain region 328, etc.) from later semiconductor processing techniques. Moreover, the thickness (T1) of the ILD region(s) 330 functions in determining the location and the magnitude of the device 100 breakdown voltage without significantly degrading the on-state resistance. As described above, the ILD region 330 thickness is approximately equal to or greater than two and one half (2.5) microns. For example, a simulation of a seven hundred volt (700 V) LDMOS device having an ILD thickness of four (4.0) microns had a breakdown voltage greater than four hundred volts (400 V) compared with a seven hundred volt (700 V) LDMOS device having an ILD thickness of one and one half (1.5) microns.

The thickness (T1) of the ILD region(s) 330 may depend on the requirements (e.g., manufacturability, operating frequency, gain, efficiency, etc.) of the device 300. For example, a LDMOS device 300 having an operating voltage of 700V may be suited to have ILD region 330 thickness of approximately two and one half (2.5) microns to increase the breakdown voltage and leave the on-state resistance relatively unchanged. In another example, a LDMOS device 300 having an operating voltage of 750V may be suited to have ILD region 330 thickness of approximately three and one half (3.5) microns. In another example, a LDMOS device 300 having an operating voltage of 800V may be suited to have ILD region 330 thickness of approximately four and one half (4.5) microns.

Once the ILD region(s) 330 are formed, one or more vias (e.g., contacts) 332 are formed to allow connections to the gate 320, the source region 324, and the drain region 328. The vias 332 are formed through one or more suitable etching techniques (e.g., wet etch, dry etch, etc.). The etching may provide a via 332 aspect ratio (height to width ratio) of about two to one (2:1) to about four to one (4:1). A conductive material is deposited in the vias 332 to form contacts 334 that provide electrical interconnections between various components of the device 100. In one or more implementations, the conductive material may be comprised of a metal 1 material, a metal 2 material, and so forth. As described above, the contacts 334 form electrodes for the source region 324 and the drain region 330. In one or more implementations, the contact 334A connects the source region 324 and the body region 326 together so that the source region 324 and the body region 326 are held at the same potential.

Finally, one or more field plate(s) are then formed over the ILD region (Block 214). As shown in FIG. 5, a first field plate 336A is formed and at least partially extends laterally over the gate 320 and the LOCOS region 314 (or STI region), and a second field plate 336B at least partially extends laterally over the drain 328. The field plate(s) 336 are configured to assist in shaping the electric field under the LOCOS region 314 to improve the breakdown voltage when the devices 300 are operational. The field plate 336 may be configured in a variety of ways. For example, the field plate 336 may be comprised of a conductive material, such as a metal material or a polysilicon layer. In one or more implementations, the thickness of the field plate 336 may range from approximately two thousand (2000) Angstroms to approximately forty thousand (40,000) Angstroms. It is contemplated that the thickness of the field plate(s) 336 may be a function of the desired operating voltage.

The LDMOS devices 300 illustrated in FIGS. 3 through 5 are fabricated with a bulk substrate wafer. Moreover, while FIGS. 3 through 5 illustrate an n-channel LDMOS device 300, the devices 300 may also be fabricated as p-channel devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A semiconductor device comprising:
   a substrate having a source region of a first conductivity type and a drain region of the first conductivity type formed proximate to a surface of the substrate;
   an extended drain region of the first conductivity type disposed in the substrate, the extended drain region having the drain region formed therein;

a gate positioned over the surface and between the source region and the drain region, the gate configured to receive a voltage;

an interlayer-dielectric region positioned over at least one of the surface or the gate, the interlayer-dielectric region having a thickness ranging between 2.5 microns and 4.0 microns for supporting breakdown voltages ranging between 800 volts and 900 volts while maintaining a relatively constant on-state resistance per unit area;

a first field plate at least partially positioned over the gate and configured to shape an electrical field generated at least partially between the source region and the drain region when the voltage is applied to the gate, the first field plate electrically connected to the gate;

a second field plate at least partially positioned over the drain region, the second field plate electrically connected to the drain region;

a LOCOS region disposed between the source region and the drain region, wherein the extended drain region at least partially extends below the LOCOS region; and a reduced surface field (RESURF) region disposed in the extended drain region, wherein the first field plate and the second field plate are disposed directly over the interlayer-dielectric region, wherein the first field plate is disposed over the reduced surface field (RESURF) region.

2. The semiconductor device as recited in claim 1, wherein the gate and a field plate at least partially extend over the LOCOS region so that the field plate is configured to shape the electrical field occurring at least partially under the LOCOS region.

3. The semiconductor device as recited in claim 1, wherein the substrate is comprised of the first conductivity type, wherein a doping profile of the extended drain region is at least three times greater than a doping profile of the substrate.

4. The semiconductor device as recited in claim 1, wherein the extended drain region extends from the drain region to a well region of a second conductivity type, the well region including the source region, the extended drain region having a length ranging between 30 microns and 100 microns.

5. A semiconductor device comprising:

a substrate having a source region of a first conductivity type and a drain region of the first conductivity type formed proximate to a surface of the substrate;

an extended drain region of the first conductivity type disposed in the substrate, the extended drain region having the drain region formed therein;

a gate positioned over the surface and between the source region and the drain region, the gate configured to receive a voltage;

an interlayer-dielectric region positioned over the surface and the gate, the interlayer-dielectric region having a thickness ranging from 2.5 microns to 4.0 microns for supporting breakdown voltages ranging between 800 volts and 900 volts while maintaining a relatively constant on-state resistance per unit area;

a first field plate at least partially positioned over the gate and configured to shape an electrical field generated at least partially between the source region and the drain region when the voltage is applied to the gate, wherein a length of the first field plate is greater than a length of the gate, the first field plate directly connected to the gate;

a second field plate at least partially positioned over the drain region, the second field plate electrically connected to the drain region; and a reduced surface field (RESURF) region disposed in the extended drain region, wherein the first field plate and the second field plate are disposed directly over the interlayer-dielectric region, wherein the first field plate is disposed over the reduced surface field (RESURF) region.

6. The semiconductor device as recited in claim 5, wherein the gate has a gate thickness of between 200 Angstroms to 1000 Angstroms.

7. The semiconductor device as recited in claim 5, further comprising a LOCOS region disposed between the source region and the drain region, wherein the extended drain region at least partially extends below the LOCOS region.

8. The semiconductor device as recited in claim 7, wherein the gate and the first field plate at least partially extend over the LOCOS region so that the first field plate is configured to shape the electrical field occurring at least partially under the LOCOS region.

9. The semiconductor device as recited in claim 7, wherein the substrate is comprised of the first conductivity type, wherein a doping profile of the extended drain region is at least three times greater than a doping profile of the substrate.

10. The semiconductor device as recited in claim 7, wherein the extended drain region extends from the drain region to a well region of a second conductivity type, the well region including the source region, the extended drain region having a length between 30 microns and 100 microns.

11. A process comprising:

forming an extended drain region of a first conductivity type in a substrate;

forming a gate over a surface of the substrate, the gate configured to receive a voltage;

forming a source region of the first conductivity type and a drain region of the first conductivity type in the substrate so that the gate is positioned between the source region and the drain region, the drain region formed in the extended drain region;

forming an interlayer-dielectric region over the gate and the surface, the interlayer-dielectric region having a thickness ranging between 2.5 microns and 4.0 microns for supporting breakdown voltages ranging between 800 volts and 900 volts while maintaining a relatively constant on-state resistance per unit area;

forming a first field plate that is connected to and at least partially over the gate, the first field plate configured to shape an electrical field generated between the source region and the drain region when a voltage is applied to the gate;

forming a second field plate that is connected to and at least partially over the drain region; and forming a RESURF region of a second conductivity type in the extended drain region, wherein the first field plate and the second field plate are disposed directly over the interlayer-dielectric region, wherein the first field plate is disposed over the reduced surface field (RESURF) region.

12. The process as recited in claim 11, wherein forming the source region further comprises forming a well region of a second conductivity type, and forming the source region in the well region proximate to a body region.

13. The process as recited in claim 11, wherein the extended region has a doping level ranging from $5 \times 10^{14}/cm^3$ to $5 \times 10^{16}/cm^3$.

* * * * *